US009651802B2

(12) United States Patent
Ogawa et al.

(10) Patent No.: US 9,651,802 B2
(45) Date of Patent: May 16, 2017

(54) METHOD OF MANUFACTURING EYEGLASS LENS

(71) Applicants: Naomi Ogawa, Tokyo (JP); Nobuyuki Tadokoro, Tokyo (JP); Makoto Adachi, Tokyo (JP); Hitoshi Kamura, Tokyo (JP); Yuko Komine, Tokyo (JP)

(72) Inventors: Naomi Ogawa, Tokyo (JP); Nobuyuki Tadokoro, Tokyo (JP); Makoto Adachi, Tokyo (JP); Hitoshi Kamura, Tokyo (JP); Yuko Komine, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 0 days.

(21) Appl. No.: 14/389,207

(22) PCT Filed: Mar. 15, 2013

(86) PCT No.: PCT/JP2013/057505
§ 371 (c)(1),
(2) Date: Sep. 29, 2014

(87) PCT Pub. No.: WO2013/146382
PCT Pub. Date: Oct. 3, 2013

(65) Prior Publication Data
US 2015/0064341 A1  Mar. 5, 2015

(30) Foreign Application Priority Data

Mar. 30, 2012 (JP) ................. 2012-079065

(51) Int. Cl.
| | | |
|---|---|---|
| C23C 16/52 | (2006.01) | |
| G02C 7/02 | (2006.01) | |
| C23C 14/24 | (2006.01) | |
| C23C 14/08 | (2006.01) | |
| G02B 1/115 | (2015.01) | |
| B29D 11/00 | (2006.01) | |
| G02B 1/116 | (2015.01) | |

(52) U.S. Cl.
CPC ........ *G02C 7/022* (2013.01); *B29D 11/00951* (2013.01); *C23C 14/083* (2013.01); *C23C 14/24* (2013.01); *G02B 1/115* (2013.01); *G02B 1/116* (2013.01)

(58) Field of Classification Search
CPC .. C23C 14/24; C23C 14/083; B29D 11/00951
USPC .......................................................... 427/8
See application file for complete search history.

(56) References Cited

U.S. PATENT DOCUMENTS

| | | | | |
|---|---|---|---|---|
| 2006/0285213 A1* | 12/2006 | Kanda | ...................... | H01B 1/08 359/619 |
| 2009/0093356 A1* | 4/2009 | Yamamoto | .............. | C03C 1/006 501/10 |
| 2010/0103523 A1* | 4/2010 | Fukui | ..................... | G02B 1/115 359/581 |

FOREIGN PATENT DOCUMENTS

| | | |
|---|---|---|
| JP | 6-82862 A | 3/1994 |
| JP | 2002-122820 A | 4/2002 |
| JP | 2006215081 A | 8/2006 |
| JP | 2007127681 A | 5/2007 |
| JP | 2007-525592 A | 9/2007 |
| JP | 2009-193022 A | 8/2009 |
| JP | 2011013654 A | 1/2011 |

OTHER PUBLICATIONS

Wang et al. Influence of Annealing on the Grain Growth and Thermal Diffusivity of Nanostructured YSZ Thermal Barrier Coating, J. Mater. Sci. Technol. vol. 22 No. 56, 2006, pp. 793-797.*
Extended European Search Report issued in corresponding European Patent Application No. 13769297.6 issued Sep. 11, 2015.
International Search Report and Search Opinion issued in PCT/JP2013/057505.
Japanese version of International Preliminary Report on Patentability of Chapter 1, with attached Written Opinion, received in counterpart PCT/JP2013/057505.
English version of International Preliminary Report on Patentability of Chapter 1, with attached Written Opinion, received in counterpart PCT/JP2013/057505.
Australian Office Action issued in corresponding Australian Application No. 2013238165 issued Mar. 31, 2016.
Canadian Office Action issued in corresponding Canadian Application No. 2,868,976 issued Apr. 11, 2016.
Japanese Office Action issued in corresponding Japanese Patent Application No. 2014-507715 issued Mar. 14, 2017.

* cited by examiner

*Primary Examiner* — Kelly M Gambetta
(74) *Attorney, Agent, or Firm* — Sughrue Mion, PLLC

(57) ABSTRACT

An aspect of the present invention relates to a method of manufacturing an eyeglass lens, comprising determining a manufacturing condition by a method of determining a manufacturing condition of an eyeglass lens comprising a vapor-deposited film formed by vapor deposition using a vapor deposition source the main component of which is $ZrO_2$, and forming a vapor-deposited film by vapor deposition using a vapor deposition source the main component of which is $ZrO_2$ under the manufacturing condition that has been determined.

10 Claims, No Drawings

METHOD OF MANUFACTURING EYEGLASS LENS

CROSS-REFERENCE TO RELATED APPLICATIONS

This application is a National Stage of International Application No. PCT/JP2013/057505, filed on Mar. 15, 2013, which claims priority from Japanese Patent Application No. 2012-079065, filed on Mar. 30, 2012, the contents of all of which are incorporated herein by reference in their entirety.

TECHNICAL FIELD

An aspect of the present invention relates to a method of determining a manufacturing condition of an eyeglass lens, and more particularly, to a method of determining a manufacturing condition which makes it possible to provide km eyeglass lens comprising a vapor-deposited film formed by vapor deposition using a vapor deposition source the main component of which is $ZrO_2$ and exhibiting good heat resistance (crack resistance).

A further aspect of the present invention relates to a method of manufacturing an eyeglass lens permitting the manufacturing of a high-quality eyeglass lens exhibiting good heat resistance (crack resistance) by employing the manufacturing condition determined by the above method.

BACKGROUND ART

Generally, various properties are imparted to an eyeglass lens by forming various functional films on the lens substrate while achieving a desired refractive index by means of the lens substrate. Antireflective films imparting an antireflective property to the surface of a lens are widely employed as such functional films. Among them, vapor-deposited films that are formed using a vapor deposition source in the form of $ZrO_2$ are considered advantageous in terms of cost because they are inexpensive among the high refractive index layers constituting a multilayered antireflective film (for example, sec Japanese Unexamined Patent Publication (KOKAI) No. 2009-493022, which is expressly incorporated herein by reference in its entirety).

Eyeglass lenses are required to have good durability without deterioration even when placed in a variety of environments. For example, eyeglass lenses are sometimes worn in the bath, left in the car in summer, and worn by wearers who are active for long periods outdoors. It is desirable for them to maintain good quality without developing cracks when subjected to high temperatures in this manner. However, eyeglass lenses having vapor-deposited films formed the vapor deposition of a vapor deposition source the main component of which is $ZrO_2$ (also referred to hereinafter as "$ZrO_2$ vapor-deposited films" sometimes exhibit a decrease in adhesion between the layers constituting the multilayered antireflective film and a decrease in optical characteristics caused by the development of cracks in the vapor-deposited film at high temperatures.

In the field of manufacturing eyeglass lenses, to stably provide an eyeglass lens the quality of which does not decrease over time, accelerated durability testing is conducted on test samples prepared under candidate manufacturing conditions before determining the manufacturing conditions for actual manufacturing. Manufacturing conditions identical to the manufacturing conditions of those test samples exhibiting good test results arc normally employed in actual manufacturing. For example, when a $ZrO_2$ vapor-deposited film is formed in actual manufacturing under the manufacturing condition yielding test samples with little crack generation in accelerated durability testing by heating in an oven, it is possible to obtain an eyeglass lens exhibiting good durability without deterioration of the vapor-deposited film over an extended period of actual use.

Although the above accelerated durability testing has become essential and indispensable for reliably providing an eyeglass lens exhibiting good durability over an extended period, in the present circumstances, to manufacture an eyeglass lens that will pass the accelerated durability testing, candidate vapor deposition conditions are determined for manufacturing a finished product eyeglass lens, a $ZrO_2$ vapor-deposited film is formed under the vapor deposition condition that has been determined to prepare an eyeglass lens, and the eyeglass lens that has been prepared is subjected to accelerated durability testing. When the evaluation standards are not met, new candidate vapor deposition conditions must be selected and the whole series of steps repeated once again in a process of trial and error.

SUMMARY OF THE INVENTION

An aspect of the present invention provides for a means of conveniently determining the manufacturing condition of an eyeglass lens that permits the manufacturing of an eyeglass lens comprising a $ZrO_2$ vapor-deposited film exhibiting good heat resistance (crack resistance).

The present inventors conducted extensive research. This resulted in the discovery of the previously unknown fact that the larger the grain size observed in the planar electron microscope image of a $ZrO_2$ vapor-deposited film, the better the beat resistance and the fewer the cracks generated at high temperature. The present invention was devised based on further research conducted based on this knowledge.

An aspect of the present invention relates to a method of determining a manufacturing condition of an eyeglass lens comprising a vapor-deposited film formed by vapor deposition using a vapor deposition source the main component of which is $ZrO_2$, which comprises:

determining a candidate vapor deposition condition to be employed in vapor deposition of the vapor-deposited film in actual manufacturing;

forming a test vapor-deposited film by conducting vapor deposition under the candidate vapor deposition condition that has been determined; and taking a planar electron microscope image of the test vapor-deposited film that has been formed and determining a vapor deposition condition of the vapor-deposited film in actual manufacturing with a determination standard that the larger the grain size observed. in the planar electron microscope image, the better the candidate vapor deposition condition permitting formation of a vapor-deposited film exhibiting heat resistance.

In an embodiment, the planar electron microscope image is a planar TEM image.

In an embodiment, the grain size to be employed for the determination is an average value of the grain size.

A further aspect of the present invention relates to a method of manufacturing an eyeglass lens, which comprises:

determining a manufacturing condition by the above method; and forming a vapor-deposited film by vapor deposition using a vapor deposition source the main component of Which is $ZrO_2$ under the manufacturing condition that has been determined.

In an embodiment, the vapor-deposited film is formed as a layer constituting a multi-layered antireflective film.

An aspect of the present invention can provide an eyeglass lens having good durability in which the generation of cracks in a $ZrO_2$ vapor-deposited film is inhibited at high temperature.

MODE FOR CARRYING OUT THE INVENTION

An aspect of the present invention relates to a method of determining a manufacturing condition of an eyeglass tem comprising a vapor-deposited film formed by vapor deposition using a vapor deposition source the main component of which is $ZrO_2$. The method of determining a manufacturing condition of an aspect of the present invention comprises determining a candidate vapor deposition condition to be employed in vapor deposition of the vapor-deposited film in actual manufacturing; forming a test vapor-deposited film by conducting vapor deposition under the candidate vapor deposition condition that has been determined; and taking a planar electron microscope image of the test vapor-deposited film that has been formed and determining a vapor deposition condition of the vapor-deposited film in actual manufacturing with a determination standard that the larger the grain size observed in the planar electron microscope image, the better the candidate vapor deposition condition permitting formation of a vapor-deposited film exhibiting heat resistance. The above method of determining a manufacturing condition was discovered by the present inventors based on the new knowledge of the good correlation between the grain size observed in the planar electron microscope image and the heat resistance of a $ZrO_2$ vapor-deposited film. This made it possible to determine the manufacturing condition for providing an eyeglass lens comprising a $ZrO_2$ vapor-deposited film having good heat resistance (crack resistance) without trial and error including accelerated durability testing for determining a vapor deposition condition.

The method of determining a manufacturing condition of an aspect of the present invention will be described in greater detail below. The term TEM is an abbreviation for a transmission electron microscope.

The eyeglass lens for which the manufacturing condition is determined is an eyeglass lens comprising a vapor-deposited film ($ZrO_2$ vapor-deposited film) formed by vapor deposition using a vapor deposition source the main component of which is $ZrO_2$. In the present invention, the term "main component" means the component accounting for the greatest portion of the vapor deposition source or the vapor-deposited layer. It is normally a component that accounts for about 50 mass % to 100 mass %, or about 90 mass % to 100 mass %, of the total. When about equal to or more than 50 mass % of $ZrO_2$ is contained in the vapor deposition source, the vapor-deposited layer that is formed will be capable of functioning as a high refractive index layer. This high refractive index layer can be combined with a low refractive index layer that is formed with. a main component such as $SiO_2$, for example, to obtain a multi layered antireflective film. Trace quantities of impurities that are unavoidably mixed in will sometimes be contained in a vapor deposition source. Other components in ranges that do not compromise the function of the main component, such as other inorganic substances and known additive components that play roles in assisting vapor deposition, can also he contained. The vapor deposition can be conducted by the vacuum vapor deposition method, ion plating method, plasma CVD method, ion assisted method, reactive sputtering method, or the like. The ion assisted method is desirable for achieving good adhesion. Further, the ion assisted method permits film formation at relative low temperatures and is thus a desirable vapor deposition method from the perspective of being suited to application to plastic lens substrates.

For example, with the ion assisted method, the physical properties of the vapor-deposited film that is formed can be controlled by the vapor deposition condition such as the degree of vacuum during vapor deposition, the acceleration voltage, the acceleration current, the flow rates and blending ratio of the assist gas (ionized gas), and the composition of the vapor deposition source employed. In the present invention, the vapor deposition condition of the $ZrO_2$ vapor-deposited film that is employed in actual manufacturing is determined by the following process without considerable trial and error. Thus, the manufacturing condition ($ZrO_2$ vapor-deposited film vapor deposition condition) can be readily discovered that permit the manufacturing of an eyeglass lens having good durability in which the generation of cracks in the $ZrO_2$ vapor-deposited film at high temperatures is inhibited.

First, a candidate condition for the vapor deposition of a $ZrO_2$ vapor-deposited film is determined for manufacturing a finished lens product. For example, when employing the ion assisted method in actual manufacturing, the various conditions set forth above are determined. When other vapor deposition method is being employed, the various conditions of that vapor deposition method are determined.

Next, a test vapor-deposited film ($ZrO_2$ vapor-deposited film) is prepared by conducting vapor deposition under the vapor deposition condition that has been determined above. The test vapor-deposited film can be formed in the same manner as in actual manufacturing on a lens substrate or on the surface of a functional film on a lens substrate, or can be formed on a test substrate such as glass. From the perspective of facilitating observation by TEM, the test vapor-deposited film is desirably prepared on a plate of glass.

The test vapor-deposited film that has been prepared is observed under a planar electron microscope. The term "observed under a planar electron microscope" means employing a technique of observation in a direction that is perpendicular or roughly perpendicular to the direction of thickness of the vapor-deposited film that is being observed with an electron microscope such as an atomic force microscope (AFM) and a transmission electron microscope (TEM). By contrast, a technique of observation in a direction parallel to the direction of thickness is sectional electron microscope observation. Based on investigation by the present inventors, clear differences were not observed in sectional electron microscope images between $ZrO_2$ vapor-deposited films with differences in heat resistance (crack resistance). Nor were clear differences between $ZrO_2$ vapor-deposited films with differences in heat resistance (crack resistance) observed in elemental analysis by TEM-EDS. The fact that analysis results correlating specifically with the heat resistance (crack resistance) of $ZrO_2$ vapor-deposited films were obtained by planar electron microscope observation is a novel discovery by the present inventors. The planar electron microscope image in the present invention can be taken by a known technique using an electron microscope such as a TEM or AFM.

The planar electron microscope image of the test vapor-deposited film can be taken as a bright-field image or as a dark-field image. To facilitate grain analysis, it is desirable to take the planar electron microscope image as a dark-field image. Based on differences in shading in the planar electron microscope image that is taken, a single region that is determined to be of granular or cluster shape is identified as a single rain. In this context, the term "grain" generally refers to the primary particle, secondary particle, and the like monocrystal polycrystal. The size of individual grains can be manually measured or can be automatically obtained using analysis software. For example, the major or minor diameter of the granular region can be adopted as the grain size. The equivalent circle diameter obtained by the circle projection method can also be adopted as the grain size. The grain size serving as an indicator in determining the manufacturing condition can be, for example, the maximum size, minimum size, or average value of the grains in a prescribed region of the planar electron microscope image. As indicated in Examples further below, the grain size thus obtained correlates with the heat resistance (crack resistance) of the $ZrO_2$ vapor-deposited film. The present inventors determined that the greater the grain size, the fewer the cracks generated at high temperatures. Accordingly, in the present invention, the vapor deposition condition for the vapor-deposited film in actual manufacturing is determined with the determination standard that the larger the grain size that is observed in the planar electron microscope image, the better the heat resistance that will be exhibited by the vapor-deposited film formed under the candidate vapor deposition condition. For example, in an embodiment, among, two or more sets of candidate conditions, the actual manufacturing condition can be determined by a relative determination of adopting the condition of the largest grain size in the planar electron microscope image as the vapor deposition condition for the $ZrO_2$ vapor-deposited film in actual manufacturing. In another embodiment, preliminary tests are conducted and a database is created of the correlation between the vapor deposition conditions of $ZrO_2$ vapor-deposited films and their tendency to crack at high temperatures. Based on the database, thresholds (critical values) of the grain sizes permitting the formation of $ZrO_2$ vapor-deposited films with good heat resistance are set, and those grain sizes at or above the threshold can be determined to he vapor deposition conditions for $ZrO_2$ vapor-deposited films in actual manufacturing. In still another embodiment, vapor deposition conditions that add changes (such as a change in the degree of vacuum) so as to increase the heat resistance or not affect the heat resistance to candidate vapor deposition conditions determined to permit the formation of $ZrO_2$ vapor-deposited films with good heat resistance based on either the relative determination results or the threshold-based determination results can be determined as the vapor deposition conditions of the $ZrO_2$ vapor-deposited film in actual manufacturing.

It is possible to obtain an eyeglass lens exhibiting good durability without going through the trial and error accompanying accelerated durability testing by determining the vapor deposition condition of the $ZrO_2$ vapor-deposited film in actual manufacturing based on the grain size observed in the planar electron microscope image in this manner.

A further aspect of the present invention provides a method of manufacturing an eyeglass lens, which comprises determining a manufacturing condition by the method of determining a manufacturing condition according to an aspect of the present invention, and thrilling a vapor-deposited film by vapor deposition using a vapor deposition source the min component of which is $ZrO_2$ under the manufacturing condition that has been determined.

As set forth above, the method of determining a manufacturing condition of an aspect of the present invention permits the determination of a manufacturing condition permitting the forming of a $ZrO_2$ vapor-deposited film having good heat resistance (crack resistance). Thus, forming a $ZrO_2$ vapor-deposited film based on the manufacturing condition determined by the above method permits the manufacturing of an eyeglass lens having good durability in which the generation of cracks in the $ZrO_2$ vapor-deposited film at high temperature is inhibited.

The $ZrO_2$ vapor-deposited film can function as a high refractive index layer. It can be formed on a lens substrate as a single layer, or can be provided on a lens substrate as a multilayered antireflective film in combination with a layer of differing refractive index, such as a low refractive index layer formed with $SiO_2$ as the main component. The multilayered antireflective film can further comprise one or more layers of vapor-deposited films (also referred to as "conductive oxide layers", hereinafter) formed by vapor deposition using a vapor deposition source comprised primarily of an electrically conductive oxide. Providing the conductive oxide layer can prevents the adhesion of dust and debris to the surface of the lens. Indium oxide, tin oxide, zinc oxide, and composite oxides thereof, which are known to be transparent conductive oxides, are desirably employed as the above conductive oxide so as not to decrease the transparence of the eyeglass lens. An example of a conductive oxide that is preferred from the perspectives of transparence and conductivity is indium-tin oxide (ITO).

The $ZrO_2$ vapor-deposited film or a multilayered antireflective film containing it can be directly formed on a lens substrate, or can he formed over a functional film such as a hard coat layer provided on the lens substrate. With the exception that the manufacturing condition ($ZrO_2$ vapor-deposited film vapor deposition condition) is determined by the method of determining a manufacturing condition of the present invention, known techniques can be applied without limitation to the method of manufacturing an eyeglass lens of the present invention.

EXAMPLES

The present invention will be described below based on Examples. However, the present invention is not limited to the embodiments disclosed in Examples. A vapor deposition source comprised of the stated oxides except for impurities that might be inevitably mixed in was employed below. The film thicknesses given below are optical film thicknesses calculated from the film formation conditions.

1. Determining Candidate Vapor Deposition Conditions

A $ZrO_2$ vapor-deposited film was formed to a film thickness of about 70 nm by the ion assisted method under the conditions given in Table 1 on a glass plate using $ZrO_2$ as the vapor deposition source.

TABLE 1

| | Ion gun conditions | | Quantity of assist | Degree |
|---|---|---|---|---|
| | Current (mA) | Voltage (V) | gas introduced $O_2$ or $O_2$/Ar [sccm] | of vacuum |
| Condition 1 | 150 | 300 | 20 | 4.3E−3 Pa |
| Condition 2 | 250 | 500 | 20 | 4.3E−3 Pa |

2. Measurement of Average Grain Size in Planar TEM Image

The $ZrO_2$ vapor-deposited film prepared by vapor deposition under Condition 1 and the $ZrO_2$ vapor-deposited film prepared by vapor deposition under Condition 2 in 1. above were shaved away by etching by ion milling a portion of the glass plate from the opposite surface from that on which had been formed the $ZrO_2$ vapor-deposited film. The etching was halted when the $ZrO_2$ vapor-deposited film had been shaved to a thickness of about 20 nm. The sample thus prepared was introduced into a transmission electron microscope and a planar TEM image (dark-field image) was taken at a magnification of 100,000-fold. Within each planar TEM image, the number of grains was tallied and the major diameter of each grain was manually measured within a surface area region of 50 μm×50 μm. The average grain size was calculated. The results are given in Table 2.

TABLE 2

| | Average grain size |
|---|---|
| Condition 1 | 5.8 nm |
| Condition 2 | 11.5 nm |

3. Evaluation of Heat Resistance

A $ZrO_2$ vapor-deposited film formed on a plastic lens substrate (product name EYAS, made by HOYA (Ltd.), refractive index 1.6, colorless lens) by the same method as in 1. above was placed for 2 hours in a heating furnace at the internal temperature shown in Table 3. Subsequently, the presence of cracks several centimeters or more in length in the $ZrO_2$ vapor-deposited film was evaluated under a fluorescent lamp. The presence of cracks was evaluated as X, and the absence of cracks as o. The results are given in Table 3.

TABLE 3

| Heating temperature within the hearing furnace | Evaluation of cracks in $ZrO_2$ vapor-deposited film formed under Condition 1 | Evaluation of cracks in $ZrO_2$ vapor-deposited film formed under Condition 1 |
|---|---|---|
| 80° C. | x | o |
| 85° C. | x | o |
| 90° C. | x | o |
| 95° C. | x | o |
| 100° C. | x | o |

Based on the above results, it was determined that as the grain sizes observed in the planar TEM image increased, the heat resistance of the $ZrO_2$ vapor-deposited film improved.

4. Preparation of Eyeglass Lenses

The total of 8 layers of vapor-deposited films shown in Table 4 were sequentially formed by the ion assisted method employing oxygen, or a mixed gas of oxygen and argon, as the assist gas on the surface of a hard coat on the convex surface side of a plastic lens substrate (product name EYAS, made by HOYA (Ltd.), refractive index 1.6, colorless lens) with a convex surface on the object side and a concave surface on the eyeball side, both surfaces of which had been optically finished and coated with hard coats in advance. Once the eighth layer of vapor-deposited film had been formed, a water-repellent layer was formed as a ninth layer over the other layers. An organic silicon compound containing a fluorine-substituted alkyl group, KY130, made by Shen-Etsu Chemical Co., Ltd., was employed as the vapor deposition source. Vapor deposition was conducted by halogen heating to form the film. Two types of eyeglass lens (eyeglass lenses 1 and 2) were prepared. During the preparation of eyeglass lens 1, the above Condition 1 was employed as the vapor deposition condition for the $ZrO_2$ vapor-deposited film, and during the preparation of eyeglass lens 2, the above Condition 2 was employed as the vapor deposition condition for the $ZrO_2$ vapor deposition film. The remaining manufacturing conditions were identical.

TABLE 4

| | Vapor deposition source | Film thickness (nm) |
|---|---|---|
| Layer 1 | $SiO_2$ | 30 |
| Layer 2 | $ZrO_2$ | 10 |
| Layer 3 | $SiO_2$ | 200 |
| Layer 4 | ITO | 10 |
| Layer 5 | $ZrO_2$ | 30 |
| Layer 6 | $SiO_2$ | 20 |
| Layer 7 | $ZrO_2$ | 60 |
| Layer 8 | $SiO_2$ | 90 |

5. Heat Resistance Test of Eyeglass Lens Sample

The eyeglass lenses prepared in 4. above were placed for one hour in an oven at 100° C. A fluorescent lamp was then applied and the lenses were visually evaluated for cracks. Eyeglass lenses 1, with $ZrO_2$ vapor-deposited films prepared under Condition 1, presented numerous cracks with a length of several centimeters in the $ZrO_2$ vapor-deposited film. By contrast, eyeglass lenses 2, with $ZrO_2$ vapor-deposited films prepared under Condition 2, did not have cracks generated and were highly transparent.

Based on the results in 5. above, the preparation of the $ZrO_2$ vapor-deposited film under the vapor deposition condition determined to yield good heat resistance based on the grain size observed in a planar TEM image was determined to yield an eyeglass lens having good durability. Conventionally, discovering vapor deposition conditions permitting the formation of $ZrO_2$ vapor-deposited films with good heat resistance in this manner would require the repeated selection of candidate conditions and implementation of accelerated durability tests, such as by the oven heating implemented in 5. above. By contrast, the present invention makes it possible to determine manufacturing conditions making it possible to manufacture eyeglass lenses having good durability by means of the convenient method of preparing a test vapor-deposited film, taking a planar TEM image, and measuring the grain size.

In the present Examples, a TEM was employed as the electron microscope. It is also possible to employ an AFM that permits morphological differentiation of grain size.

The present invention is useful in the field of manufacturing eyeglass lenses.

The invention claimed is:

1. A method of manufacturing an eyeglass lens, which comprises:
   determining a manufacturing condition by a method of determining a manufacturing condition of an eyeglass lens comprising a vapor-deposited film formed by vapor deposition using a vapor deposition source the main component of which is $ZrO_2$; and
   forming a vapor-deposited film by vapor deposition using a vapor deposition source the main component of which is $ZrO_2$ under the manufacturing condition that has been determined, wherein the method of determining a manufacturing condition comprises:

pre-determining a threshold of grain size permitting formation of a $ZrO_2$ vapor-deposited film with a desired heat resistance;

determining a candidate vapor deposition condition to be employed in vapor deposition of the vapor-deposited film in actual manufacturing;

forming a test vapor-deposited film by conducting vapor deposition under the candidate vapor deposition condition that has been determined;

taking a transmission electron microscope (TEM) image of the test vapor deposited-film;

comparing the grain size in the TEM image with the predetermined threshold of grain size, and determining the candidate vapor deposition condition as a vapor deposition condition to be employed in a vapor deposition for actual manufacturing of an eyeglass lens when the grain size of the test vapor-deposited film is greater than the predetermined threshold of grain size, or determining a vapor deposition condition, which is determined by adding change(s) so as to increase heat resistance of a $ZrO_2$ vapor-deposited film or change(s) not affecting heat resistance of a $ZrO_2$ vapor-deposited film to the candidate vapor deposition condition, as a vapor deposition condition to be employed in a vapor deposition for actual manufacturing of an eyeglass lens when the grain size of the test vapor-deposited film is greater than the predetermined threshold of grain size.

2. The method of manufacturing an eyeglass lens according to claim 1, wherein the TEM image is a planar TEM image.

3. The method of manufacturing an eyeglass lens according to claim 1, wherein the grain size to be employed for the determination is an average value of the grain size.

4. The method of manufacturing an eyeglass lens according to claim 1, wherein the vapor-deposited film is formed as a layer constituting a multi-layered antireflective film.

5. The method of manufacturing an eyeglass lens according to claim 1, wherein the major or minor diameter of the granular region is adopted as the grain size.

6. The method of manufacturing an eyeglass lens according to claim 1, wherein the equivalent circle diameter obtained by a circle projection method is adopted as the grain size.

7. The method of manufacturing an eyeglass lens according to claim 1, wherein the grain size serving as an indicator in determining the manufacturing condition is the maximum size, minimum size, or average value of the grains in a prescribed region of the TEM image.

8. The method of manufacturing an eyeglass lens according to claim 1, wherein among two or more sets of candidate conditions, the actual manufacturing condition is determined by a relative determination of adopting the condition of the largest grain size in the TEM image as the vapor deposition condition for the $ZrO_2$ vapor-deposited film in actual manufacturing.

9. The method of manufacturing an eyeglass lens according to claim 1, wherein preliminary tests are conducted and a database is created of the correlation between the vapor deposition conditions of $ZrO_2$ vapor-deposited films and their tendency to crack at high temperatures; based on the database, the threshold is pre-determined, and those grain sizes at or above the threshold is determined to be vapor deposition conditions for $ZrO_2$ vapor-deposited films in actual manufacturing.

10. The method of manufacturing an eyeglass lens according to claim 1, wherein the change(s) added to the candidate vapor deposition condition include at least one selected from the group consisting of change of current of an ion gun and change of voltage of an ion gun employed in a vapor deposition.

* * * * *